United States Patent
Kawabata et al.

(10) Patent No.: US 7,327,627 B2
(45) Date of Patent: Feb. 5, 2008

(54) SEMICONDUCTOR MEMORY

(75) Inventors: Kuninori Kawabata, Kawasaki (JP); Shuzo Otsuka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 30 days.

(21) Appl. No.: 11/452,379

(22) Filed: Jun. 14, 2006

(65) Prior Publication Data

US 2006/0239106 A1    Oct. 26, 2006

Related U.S. Application Data

(63) Continuation of application No. PCT/JP2004/03206, filed on Mar. 11, 2004.

(51) Int. Cl.
*G11C 7/00* (2006.01)
(52) U.S. Cl. .................. 365/222; 365/230.03
(58) Field of Classification Search ............... 365/222, 365/230.03, 230.04, 230.05
See application file for complete search history.

(56) References Cited

U.S. PATENT DOCUMENTS

| | | | |
|---|---|---|---|
| 6,219,292 B1 * | 4/2001 | Jang ................... | 365/222 |
| 6,349,068 B2 * | 2/2002 | Takemae et al. ......... | 365/222 |
| 6,515,929 B1 * | 2/2003 | Ting et al. ............. | 365/222 |
| 6,590,822 B2 * | 7/2003 | Hwang et al. .......... | 365/222 |
| 2002/0001246 A1 | 1/2002 | Hidaka | |

FOREIGN PATENT DOCUMENTS

| | | |
|---|---|---|
| JP | 09-161477 | 6/1997 |
| JP | 10-222977 | 8/1998 |
| JP | 11-203858 | 7/1999 |
| JP | 11-273345 | 10/1999 |
| JP | 2000-195258 | 7/2000 |
| JP | 2000-298982 | 10/2000 |
| JP | 2001-189081 | 7/2001 |
| JP | 2002-8370 | 1/2002 |
| JP | 2002-373489 | 12/2002 |
| JP | 2003-346477 | 12/2003 |
| JP | 2004-046936 | 2/2004 |
| JP | 2004-227624 | 8/2004 |
| JP | 2004-273029 | 9/2004 |
| JP | 2004-288231 | 10/2004 |

* cited by examiner

*Primary Examiner*—Vu A. Le
(74) *Attorney, Agent, or Firm*—Arent Fox LLP.

(57) ABSTRACT

Out of memory blocks arranged in one direction, the memory blocks arranged at both ends are included in a partial area. Since part of control circuits operating the memory blocks arranged at the both ends are not shared by the other memory blocks, switching circuits connecting these control circuits to the memory blocks are constantly settable to an ON state. Since ON/OFF control of the switching circuits is not necessary, power consumption required for accessing the memory blocks arranged at the both ends is smaller than that required for accessing the other memory blocks. Therefore, including the memory blocks arranged at the both ends in a partial area makes it possible to reduce power consumption during a partial refresh mode (standby current).

11 Claims, 11 Drawing Sheets

Fig. 4

SEMICONDUCTOR MEMORY

CROSS REFERENCE TO RELATED APPLICATION

This application is a continuation application of International Application PCT/JP 2004/003206, filed Mar. 11, 2004, and designating the U.S.

BACKGROUND OF THE INVENTION

1. Field of the Invention

The present invention relates to a semiconductor memory including dynamic memory cells and having a partial refresh mode.

2. Description of the Related Art

The memory capacity necessary for a hand-held terminal such as a mobile phone has been increasing year by year. Under such circumstances, a dynamic RAM (hereinafter, referred to as a DRAM) has come into use as a work memory of a hand-held terminal in place of a conventional static RAM (hereinafter, referred to as a SRAM). Chip size of a DRAM can be reduced since the number of elements constituting each memory cell thereof is smaller than that of a SRAM, and thus chip cost of the DRAM can be made lower than that of a SRAM.

Power consumption of a semiconductor memory mounted on a hand-held terminal is required to be low so as to enable long use of its battery. A DRAM as opposed to a SRAM requires a periodic refresh operation in order to retain data written to memory cells. Therefore, in a case where a DRAM is used as a work memory of a hand-held terminal, power is consumed only by retaining data even while the hand-held terminal is not in use, resulting in consumption of a battery.

In order to reduce power consumption in a standby state (in a low power mode) of a DRAM, a partial refresh technology has been developed (See Japanese Unexamined Patent Application Publication No. 2000-298982 and so on). In a DRAM having a partial refresh function, data of only limited memory cells are retained in a standby state (a partial refresh mode), thereby reducing the number of memory cells to be refreshed. Lessening the number of the memory cells to be refreshed decreases the number of times of refresh operations, enabling reduced power consumption during the partial refresh mode.

SUMMARY OF THE INVENTION

It is an object of the present invention to reduce power consumption during a partial refresh mode (standby current) in a semiconductor memory including dynamic memory cells and having a partial refresh mode.

According to a first embodiment of the present invention, a semiconductor memory includes three or more memory blocks each of which has dynamic memory cells and which operate at different timings from each other and are arranged in one direction. Each of control circuits is arranged between the memory blocks adjacent to each other, shared by the adjacent memory blocks and operates in synchronization with an operation of one of the adjacent memory blocks. Another control circuits arranged respectively on outer sides of the memory blocks arranged at both ends of the one direction operate in synchronization with operations of the respective memory blocks. Switching circuits each connect each of the control circuits to the memory block adjacent to the each control circuit.

An operation control circuit constantly keeps ON, during a partial refresh mode, the switching circuits corresponding to the control circuits positioned on the outer sides of the memory blocks arranged at the both ends, the partial refresh mode being to retain data of at least one of the memory blocks. Therefore, the number of the switching circuits that turn on (frequency of an ON/OFF operation of the switching circuits) when the memory blocks at the both ends are accessed can be made smaller than that when the other memory blocks are accessed. Therefore, setting a partial area so that it includes the memory blocks arranged at the both ends can reduce power consumption during the partial refresh mode (standby current). Here, the partial area represents the memory blocks for which a refresh operation is executed during the partial refresh mode.

For example, the control circuits are at least any of sense amplifiers, precharge circuits, and column switches. The switching circuits are bit line control switches that connect, to these circuits, bit lines connected to the memory cells of the memory blocks.

In a preferable example of the first embodiment of the present invention, each of the switching circuits is constituted of an nMOS transistor. A high-level voltage of a switch control signal supplied to a gate of the nMOS transistor is a boost voltage generated by a boost voltage generator. Therefore, turning on the switching circuit requires the operation of the boost voltage generator, resulting in increased power consumption of the whole semiconductor memory. However, in the present invention, the number of the switching circuits operating during the partial refresh mode is small as described above, which can achieve a great effect of power consumption reduction.

In another preferable example of the first embodiment of the present invention, a mode register is set from an exterior of the semiconductor memory in order to change size of the partial area. The memory blocks arranged at the both ends are included in a plurality of partial areas which are settable. Therefore, it is possible to reduce power consumption during the partial refresh mode irrespective of the size of the set partial areas.

In another preferable example of the first embodiment of the present invention, a refresh address counter sequentially generates a refresh address for refreshing the memory cells. The memory blocks included in the partial area are assigned smaller addresses in an address map. During the partial refresh mode, the refresh address counter fixes at least one of high-order bits of the refresh address to low level when outputting the refresh address. Therefore, it is possible to provide a semiconductor memory whose power consumption during the partial refresh mode is small, without impairing usability of a user of the semiconductor memory.

According to a second embodiment of the present invention, in a semiconductor memory, an even number of cell arrays each including dynamic memory cells are arranged in one direction. Decoding circuits are arranged between the cell arrays adjacent to each other and arranged on outer sides of the cell arrays arranged at both ends of the one direction. Odd-numbered decoding circuits from an end of the one direction are assigned a same address. Even-numbered decoding circuits from the end of the one direction are assigned a same address. The address assigned to the odd-numbered decoding circuits and the address assigned to even-numbered decoding circuits are different from each other.

Each of the decoding circuits arranged between two adjacent cell arrays has a driver outputting a decoded signal to the two adjacent cell arrays. Each of the decoding circuits arranged on the outer side of the cell arrays arranged at the both ends of the one direction has a driver outputting a decoded signal to one adjacent cell array. A partial area is set so as to include the memory cells connected to the drivers of the even-numbered decoding circuits. Therefore, the number of the decoding circuits operating during a partial refresh mode can be made relatively small, which enables reduction in power consumption. Here, the partial area represents the memory cells for which a refresh operation is executed during the partial refresh mode in which data of at least one of the memory blocks is retained.

For example, the semiconductor memory includes a main decoder decoding high-order addresses and sub decoders decoding low-order addresses according to an output of the main decoder, and the aforesaid decoding circuits are the sub decoders. Further, the decoded signals outputted by the decoding circuits are supplied to word lines connected to gates of transfer transistors of the memory cells.

In a preferable example of the second embodiment of the present invention, a mode register is set from an exterior of the semiconductor memory in order to change size of the partial area. The memory cells corresponding to the even-numbered decoding circuits are included in a plurality of partial areas which are settable. The memory cells corresponding to the odd-numbered decoding circuits are not included in the plural settable partial areas. Therefore, it is possible to reduce power consumption during the partial refresh mode irrespective of the size of the set partial areas.

BRIEF DESCRIPTION OF THE DRAWINGS

The nature, principle, and utility of the invention will become more apparent from the following detailed description when read in conjunction with the accompanying drawings in which like parts are designated by identical reference numbers, in which:

FIG. 4 is an explanatory chart showing a state of a refresh address signal during a partial refresh mode in the first embodiment;

DESCRIPTION OF THE PREFERRED EMBODIMENTS

Figure 1:
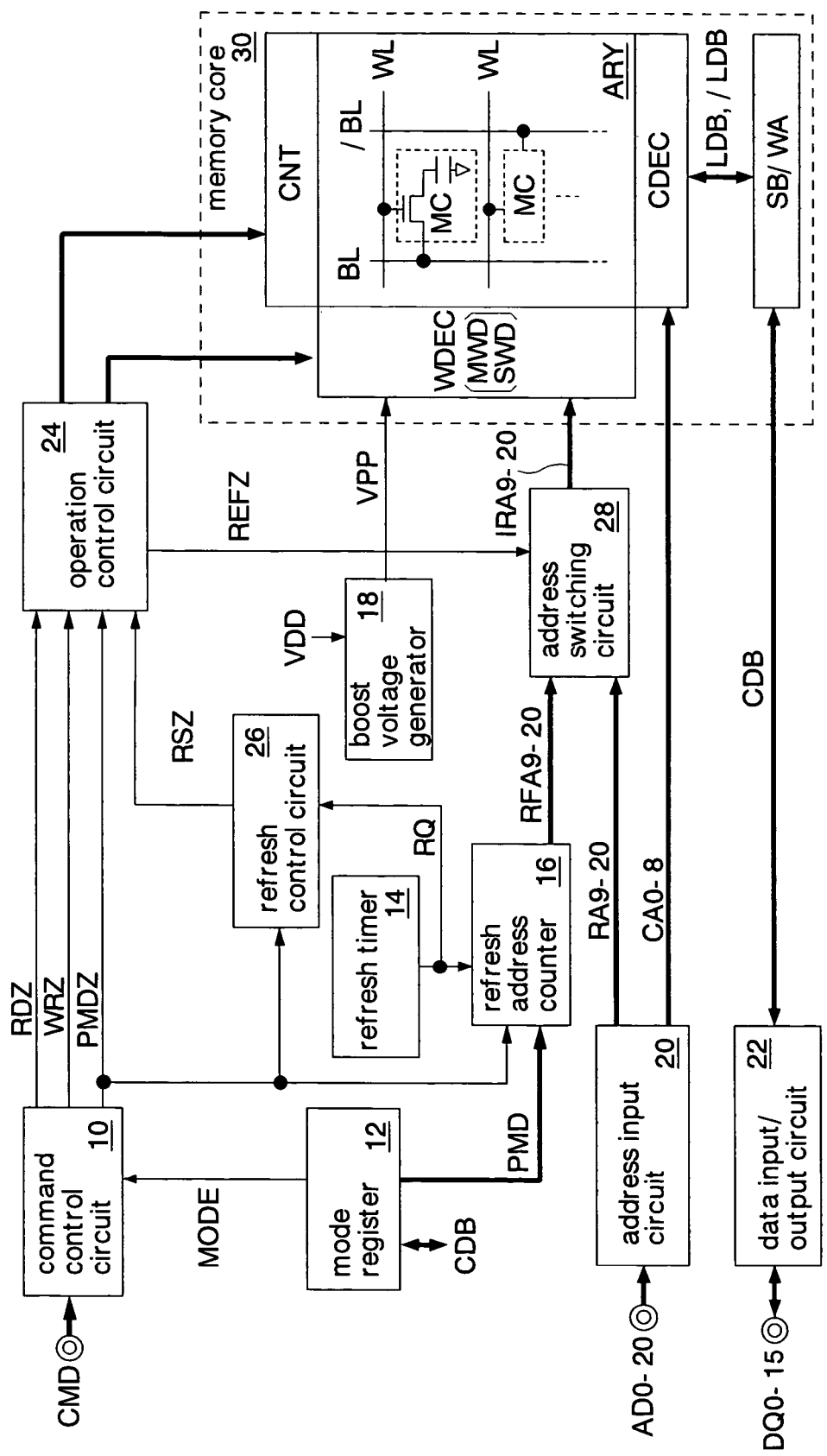
FIG. 1 is a block diagram showing a first embodiment of a semiconductor memory of the present invention.

Hereinafter, embodiments of the present invention will be described, using the drawings. The double circles in the drawings represent external terminals. In the drawings, each signal line shown by the bold line is constituted of a plurality of lines. Further, part of blocks to which the bold lines are connected is constituted of a plurality of circuits. Signals supplied via the external terminals are denoted by the same reference symbols as the terminal names. Further, signal lines are denoted by the same reference symbols as the names of signals transferred therethrough.

FIG. 1 shows a first embodiment of a semiconductor memory of the present invention. This semiconductor memory is formed as a pseudo SRAM on a silicon substrate by using a CMOS process. The pseudo SRAM has a memory core of a DRAM and has an interface of a SRAM. The pseudo SRAM periodically executes a refresh operation inside a chip without receiving a refresh command from an exterior to retain data written to memory cells. For example, this pseudo SRAM has a memory capacity of 32 Mbits (2M addresses×16 I/O) and is used as a work memory mounted on portable equipment such as a mobile phone.

The pseudo SRAM has, as operation modes, a normal operation mode in which a read operation, a write operation, and a refresh operation are executed and a low power mode in which only the refresh operation is executed. The low power mode includes a self-refresh mode and a partial refresh mode. In the self-refresh mode, all the memory cells in the pseudo SRAM are periodically refreshed.

In the partial refresh mode, only part of the memory cells in the pseudo SRAM are periodically refreshed. That is, in the self-refresh mode, data of all the memory cells are retained, while in the partial refresh mode, data of only part of the memory cells are retained. In the pseudo SRAM having the partial refresh mode, the capacity of the memories whose data are retained can be selectively reduced, so that power consumption during the partial refresh mode (standby current) is smaller than power consumption during the self-refresh mode.

The read operation and the write operation are executed according to a read command and a write command supplied via an external terminal. The refresh operation is executed in response to a refresh request generated in the pseudo SRAM without any recognition thereof by an external system.

The pseudo SRAM has a command control circuit 10, a mode register 12, a refresh timer 14, a refresh address counter 16, a boost voltage generator 18, an address input circuit 20, a data input/output circuit 22, an operation control circuit 24, a refresh control circuit 26, an address switching circuit 28, and a memory core 30. Note that FIG. 1 shows only major signals necessary for describing the present invention.

The command control circuit 10 receives a command signal CMD (for example, a chip enable signal /CE, a write enable signal /WE, an output enable signal /OE, or the like) supplied via the external terminal. The command control circuit 10 outputs a read control signal RDZ for having a read operation executed, a write control signal WRZ for having a write operation executed, or the like according to the received command signal CMD. Further, when the command signal CMD indicates the partial refresh mode, the command control circuit 10 activates a partial refresh mode signal PMDZ according to the contents set in the mode register 12.

The mode register 12 is a register for setting the operation mode of the pseudo SRAM. When a mode register setting command is supplied via a command terminal CMD, the mode register 12 is set according to logic level of a data signal supplied to a data terminal DQ. Then, whether normal self-refresh is to be executed (self-refresh mode) or partial refresh is to be executed (partial refresh mode) during the low power mode is set by a mode bit (one bit) in the mode register 12. Further, when the partial refresh mode is set, the capacity of the memories whose data are retained by the partial refresh is set to one of three kinds by partial mode bits PMD (2 bits) in the mode register 12.

The refresh timer 14 outputs a refresh request signal RQ at a predetermined cycle. In response to the refresh request signal RQ, the refresh address counter 16 performs a count operation to output a 12-bit refresh address signal RFA9-20 while receiving the low-level partial mode signal PMDZ (the normal operation mode or the self-refresh mode). The refresh address signal RFA9-20 is a row address signal for selecting a later-described word line WL. While receiving the high-level partial mode signal PMDZ (the partial refresh mode), the refresh address counter 16 fixes at least one bit of the refresh address signal RFA18-20 to low level according to the partial mode bits PMD of the mode register 12 and performs a count operation using the remaining bits in response to the refresh request signal RQ to output them as the refresh address signal RFA9-20.

The boost voltage generator 18 boosts an external supply voltage VDD to generate a boost voltage VPP. The boost voltage VPP is used as a supply voltage of later-described sub word decoders SWD (a high-level voltage of the word lines WL) and as a high-level voltage of a later-described bit line control signal BTR (or BTL).

The address input circuit 20 receives an address signal AD0-20 supplied via an address terminal and outputs the received signal as a column address signal CA0-8 and a row address signal RA9-20. The row address signal RA9-20 is supplied for word line WL selection in the read operation and the write operation. The column address signal CA is supplied for selecting later-described bit lines BL, /BL in the read operation and the write operation.

During the read operation, the data input/output circuit 22 outputs to an external terminal DQ0-15 read data which is transferred from the memory core 30 via a common data bus CDB. During the write operation, the data input/output circuit 22 receives write data via the external terminal DQ0-15 to transfer the received data to the memory core 30 via the common data bus CDB.

The operation control circuit 24 outputs a plurality of control signals for controlling the operation of the memory core 30 when receiving one of the read control signal RDZ, the write control signal WRZ, and a refresh start signal RSZ. The control signals include a signal determining the activation timing of the word lines WL, signals (PSA and NSA in FIG. 6) determining the activation timing of sense amplifiers, a signal (BRS in FIG. 6) determining the precharge timing (equalizing timing) of the complementary bit lines BL, /BL, signals (BTL, BTR in FIG. 6) connecting the bit lines BL, /BL to control circuits such as the sense amplifiers, and the like. The operation control circuit 24 also has a function of an arbiter determining the priority between externally supplied read command and write command (the command signal CMD) and an internally generated refresh command (the refresh request signal RQ). When the refresh operation is to be executed in response to the refresh command, the operation control circuit 24 activates a refresh signal REFZ (to high level).

The refresh control circuit 26 outputs the refresh start signal RSZ in response to the refresh request signal RQ. The address switching circuit 28 outputs the row address signal RA9-20 as an internal row address signal IRA9-20 when receiving the low-level refresh signal REFZ (the normal operation mode). The address switching circuit 28 outputs the refresh address signal RFA9-20 as the internal row address signal IRA9-20 when receiving the high-level refresh signal REFZ (the partial refresh mode or self refresh mode). That is, in the read operation and the write operation, the externally supplied row address signal RA9-20 is selected, while in the refresh operation, the internally generated refresh address signal RFA9-20 is selected.

Figure 6:
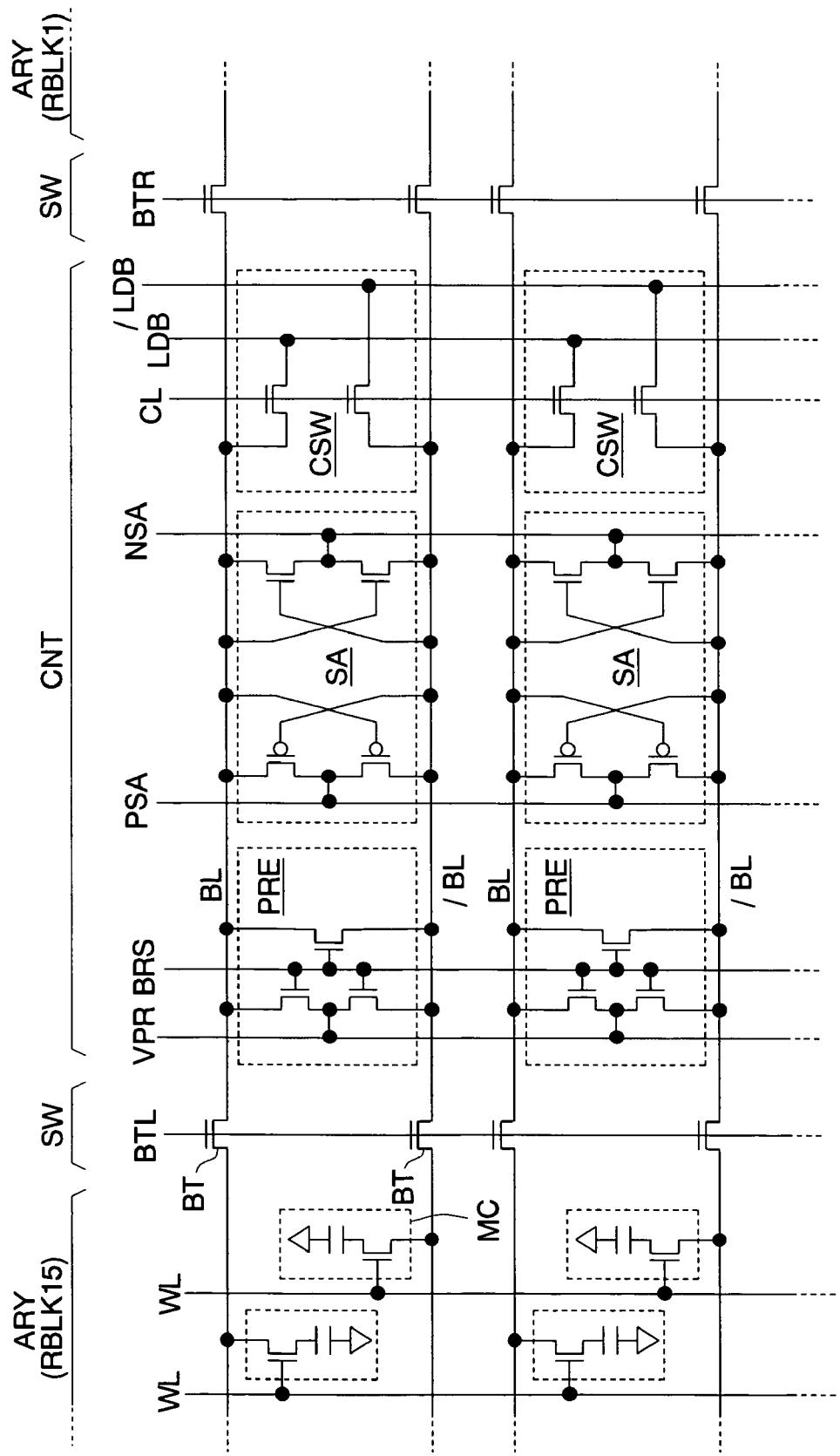
FIG. 6 is a circuit diagram showing details of a part surrounded by the frame B in bold broken line shown in FIG. 5.

The memory core 30 has cell arrays ARY, control circuits CNT, a word decoder WDEC, a column decoder CDEC, a sense buffer SB, and a write amplifier WA. Each of the cell arrays ARY has a plurality of volatile memory cells MC (dynamic memory cells) arranged in matrix, and the plural word lines WL and the plural bit line pairs BL, /BL connected to the memory cells MC. Each of the control circuits CNT has sense amplifiers SA, precharge circuits PRE, and column switches CSW, which are shown in FIG. 6.

Each of the memory cells MC is the same as a memory cell of a typical DRAM and has a capacitor for retaining data as charges and a transfer transistor arranged between this capacitor and the bit line BL (or /BL). Gates of the transfer transistors are connected to the word lines WL.

The word decoder WDEC has a row decoder (not shown) for selecting a later-described row block RBLK, main word decoders MWD, and sub word decoders SWD for word line WL selection. Each of the main word decoders MWD selects one of later-described main word lines MWLX according to the internal row address signal IRA11-16 to change the selected main word line MWLX to low level in synchronization with the control signal from the operation control circuit 24. Each of the sub word decoders SWD selects one of the four word lines WL corresponding to the activated main word line MWLX according to the internal row address signal IRA9-10. The column decoder CDEC outputs a column line signal CL for turning on column switches CSW connecting the bit lines BL, /BL to local data bus lines LDB, /LDB respectively according to the column address signal CA0-8 (see FIG. 6).

During the read operation, the sense buffer SB amplifies a signal amount of read data on the local data bus lines LDB, /LDB to output the read data to the common data bus CDB. During the write operation, the write amplifier WA amplifies a signal amount of write data on the common data bus CDB to output the write data to the local data bus lines LDB, /LDB.

Figure 2:
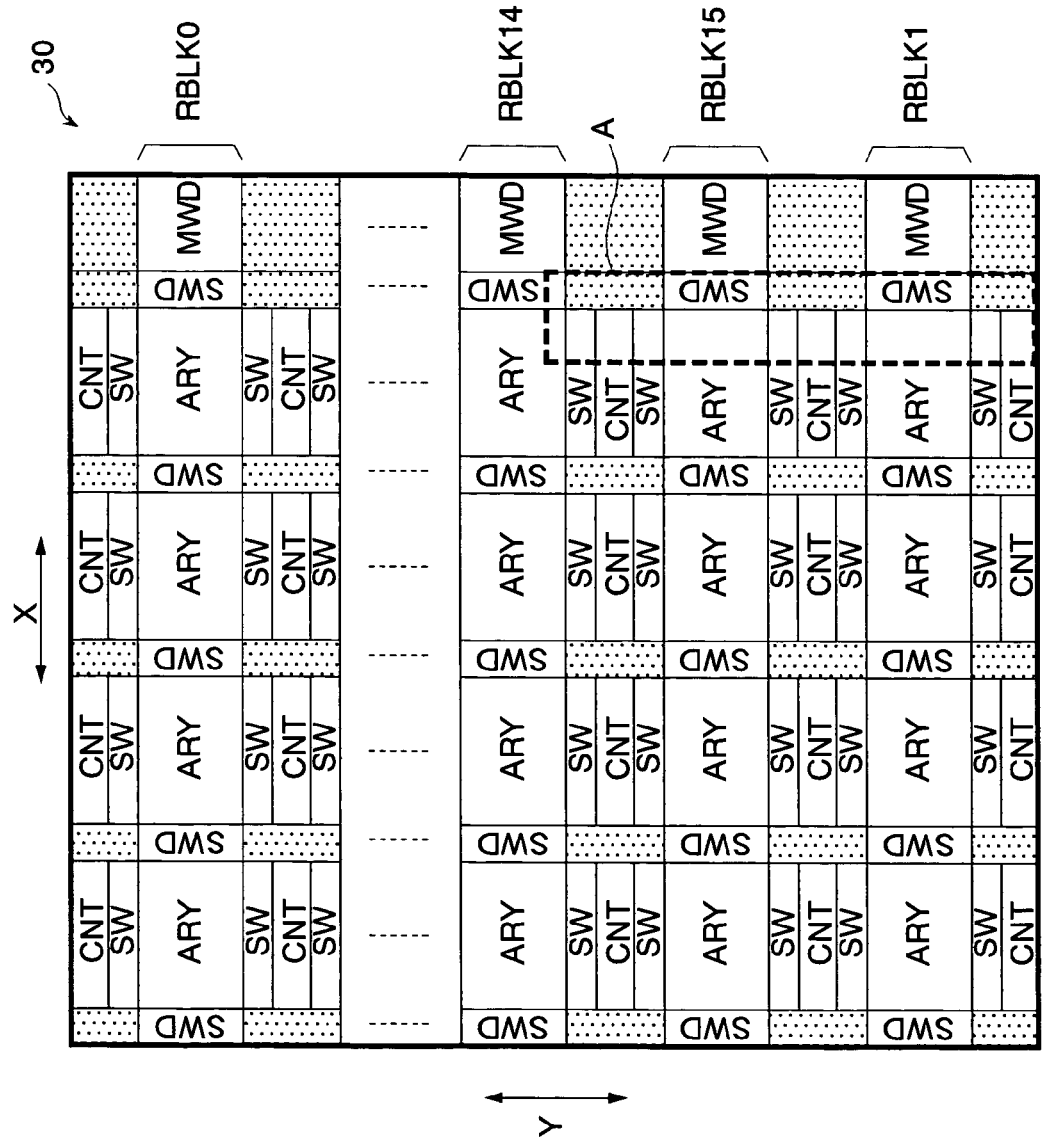
FIG. 2 is a block diagram showing details of a memory core shown in FIG. 1.

FIG. 2 shows details of the memory core 30 shown in FIG. 1. In the hatched portions in the drawing, connecting parts and so on of circuits and wirings common to a plurality of circuit blocks are formed. The memory core 30 has 16 row blocks RBLK0-RBLK15 (memory blocks) from which the selection is made according to the 4-bit internal row address signal IRA17-20. The row blocks RBLK0-RBLK15 are arranged in a vertical direction Y in the drawing. The row blocks RBLK0-1 corresponding to smaller values of the row address signal are arranged on both sides of the vertical direction Y respectively. The control circuits CNT are arranged between the row blocks RBLK adjacent to each other and on outer sides of the row blocks RBLK0-1 positioned on the both sides of the vertical direction Y, in correspondence to the cell arrays ARY respectively. The control circuits CNT are connected to the cell arrays ARY via the switching circuits SW. The control circuits CNT and the switching circuits SW will be described in detail in FIG. 6 to be described later.

Each of the row blocks RBLK0-RBLK15 has the four cell arrays ARY and the five sub word decoders SWD, which are arranged in a lateral direction X in the drawing. The four cell arrays ARY formed in each of the row blocks RBLK0-15 are also called segments. The sub word decoders SWD are arranged between the cell arrays ARY adjacent to each other and on outer sides of the cell arrays ARY positioned on both ends of the lateral direction X. In each of the row blocks RBLK, the main word decoder MWD is arranged on an outer side of the sub word decoder SWD positioned at the right end in the drawing. The frame A in bold broken line in the drawing corresponds to an area shown in FIG. 5 to be described later.

Figure 3:
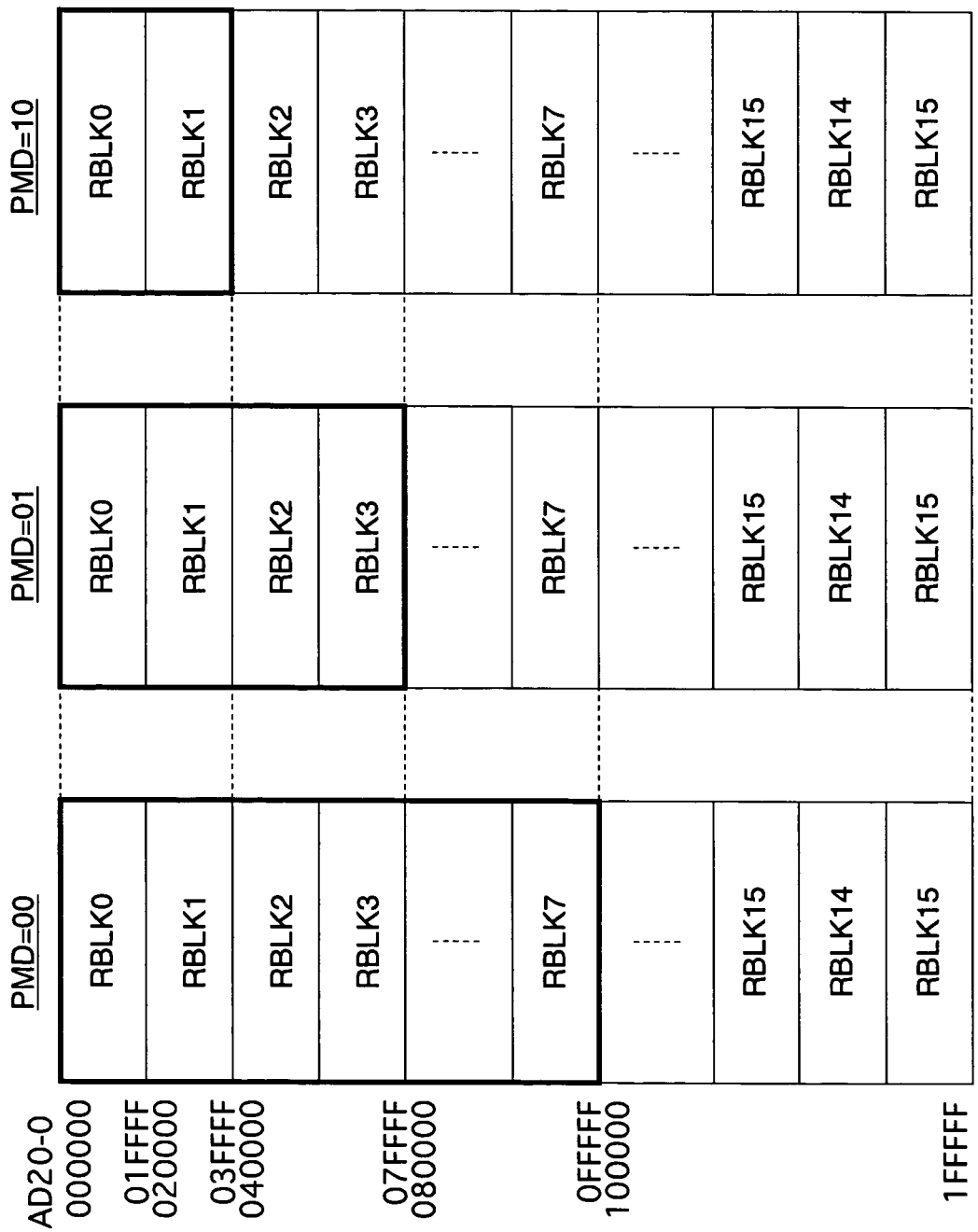
FIG. 3 is an explanatory chart showing an address map of row blocks shown in FIG. 2.

FIG. 3 shows an address map of the row blocks RBLK0-15 shown in FIG. 2. The row blocks RBLK0-15 are assigned addresses in ascending order. The memory capacity of each of the row blocks RBLK0-15 is 2 Mbits (128 k addresses ×16 I/O). Note that an address signal AD shown in the drawing includes not only the external address signal AD but also the refresh address signal RFA.

When the partial mode bits PMD of the mode register 12 are "00" in binary notation, data of 16 Mbits which is the memory capacity of the row blocks RBLK0-7 shown by the bold-line frame is retained. When the partial mode bits PMD are "01" in binary notation, data of 8 Mbits which is the memory capacity of the row blocks RBLK0-3 shown in the bold-line frame is retained (1/4 partial mode). When the partial mode bits PMD are "10" in binary notation, data of 4 Mbits which is the memory capacity of the row blocks RBLK0-1 shown in the bold-line frame is retained (1/8 partial mode). The data of the row blocks RBLK0-1 are retained in all the partial modes. Thus, during the partial refresh mode, the capacity of the memories whose data are retained can be selectively reduced. Note that 1/2, 1/4, and 1/8 represent ratios of the capacity of the memories whose data are retained during the partial refresh mode to the memory capacity (32 Mbits) of the whole pseudo SRAM.

Figure 4:
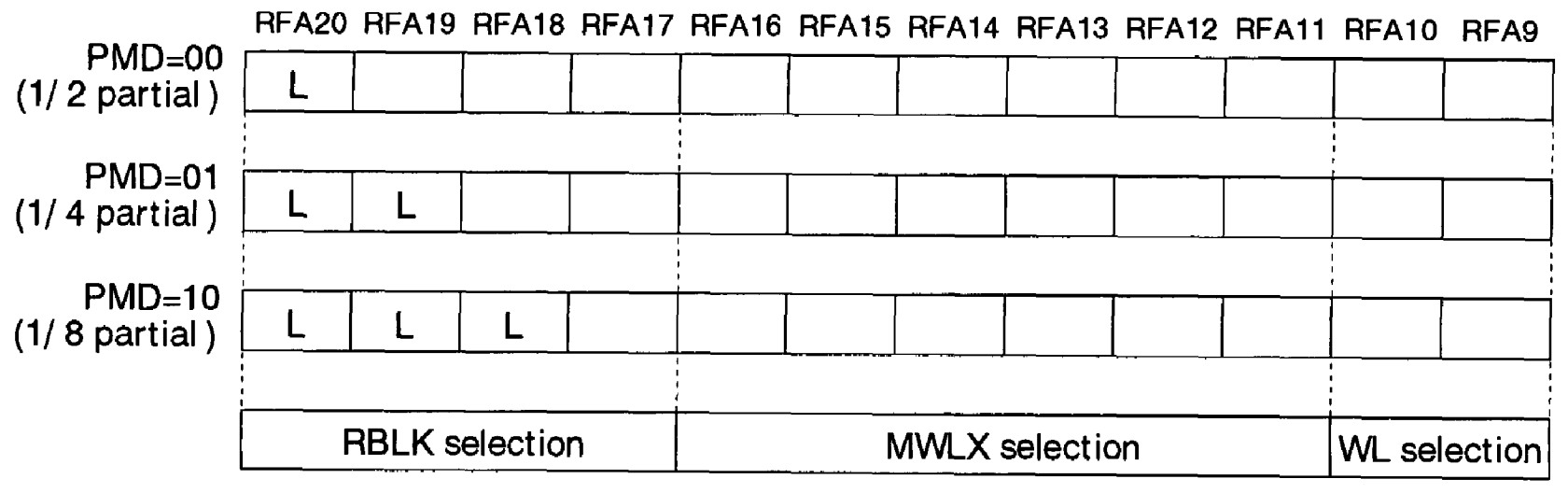

FIG. 4 shows a state of the refresh address signal RFA20-9 during the partial refresh mode in the first embodiment. During the 1/2 partial mode (PMD="00"), the refresh address counter 16 shown in FIG. 1 fixes the highest-order bit RFA20 of the row address signal to low level (L) and performs the count operation using the remaining bits RFA19-9. During the 1/4 partial mode (PMD="01"), the refresh address counter 16 fixes high-order 2 bits RFA20-19 of the row address signal to low level (L) and performs the count operation using the remaining bits RFA18-9. During the 1/8 partial mode (PMD="10"), the refresh address counter 16 fixes high-order 3 bits RFA20-18 of the row address signal to low level (L) and performs the count operation using the remaining bits RFA17-9.

The refresh address signal RFA2d-17 is used for selecting one of the row blocks RBLK. Therefore, in the 1/2 partial mode, only the refresh address signal RFA corresponding to the row blocks RBLK0-7 is generated and only data of the row blocks RBLK0-7 are retained. In the 1/4 partial mode, only the refresh address signal RFA corresponding to the row blocks RBLK0-3 is generated and only data of the row blocks RBLK0-3 are retained. In the 1/8 partial mode, only the refresh address signal RFA corresponding to the row blocks RBLK0-1 is generated and only data of the row blocks RBLK0-1 are retained. That is, the address map shown in FIG. 3 is formed.

The refresh address signal RFA16-11 is used for selecting one of the main word lines MWLX in each of the selected row blocks RBLK. The refresh address signal RFA10-9 is used for selecting one of the four word lines WL connected to the selected main word line MWLX.

Figure 5:
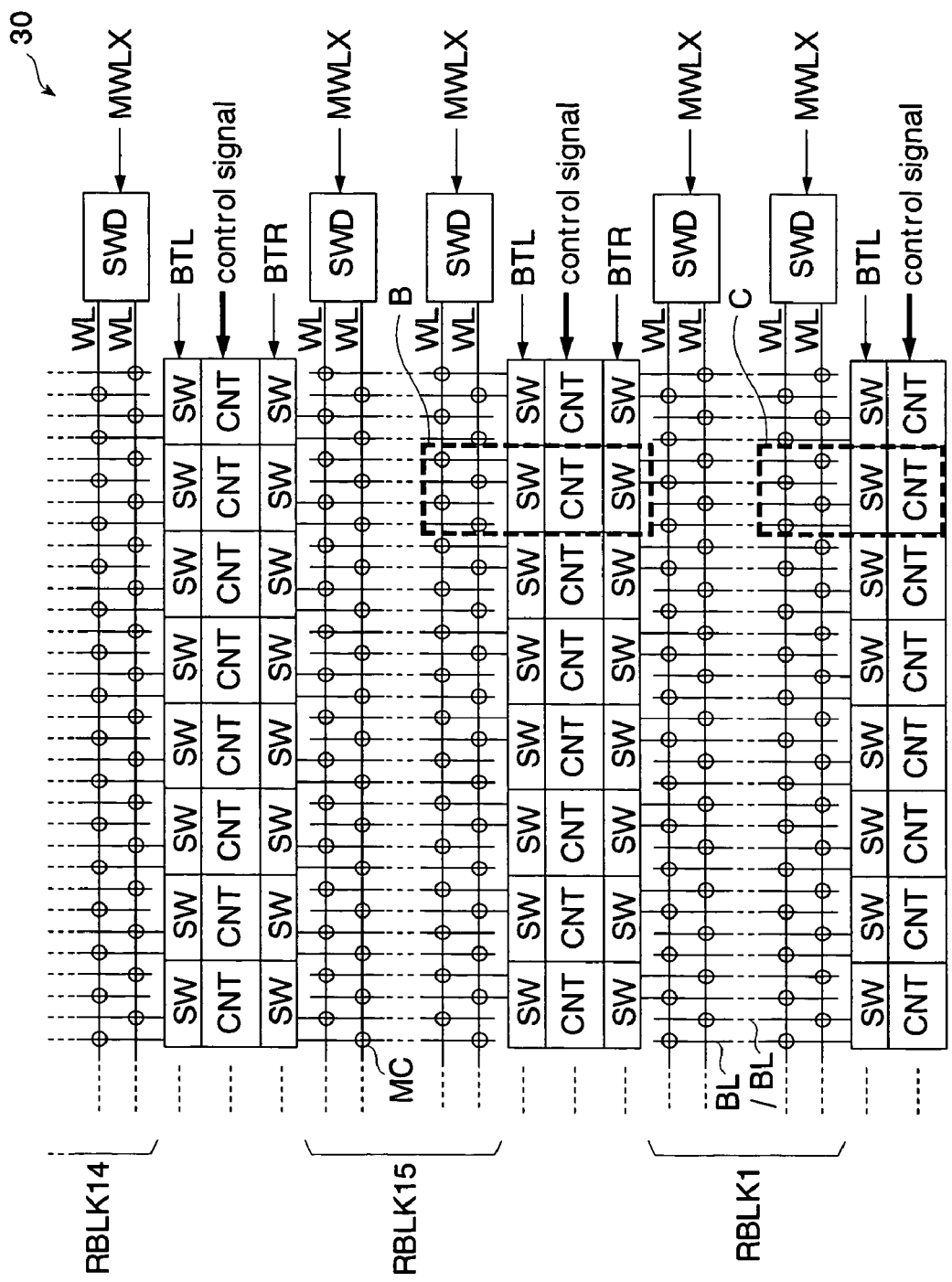
FIG. 5 is a block diagram showing details of a part surrounded by the frame A in bold broken line shown in FIG. 2.

FIG. 5 shows details of a part surrounded by the frame A in bold broken line shown in FIG. 2. Each of the row blocks RBLK0-15 is connected to the control circuits CNT (sense amplifiers and so on) via the switching circuits SW that are adjacently provided on upper and lower sides thereof. Concretely, the memory cells MC are connected to the control circuits CNT via the complementary bit lines BL, /BL and the switching circuits SW. The switching circuits SW arranged in line in the lateral direction in the drawing operate simultaneously in response to the bit line control signal BTL (or BTR).

The control circuits CNT positioned between the row blocks RBLK are shared by the two row blocks RBLK adjacent thereto. The control circuits CNT positioned on the outer sides of the row blocks RBLK0-1 (RBLK0 is not shown) at the both ends of the memory core 30 are used only by the single row block RBLK0 or RBLK1 which is adjacent thereto.

The switching circuits SW are provided to allow the two row blocks RBLK to share the control circuits CNT. When one of the two row blocks RBLK adjacent to each other is accessed, the switching circuits SW on one side, out of the pairs of the switching circuits SW corresponding to the control circuits CNT shared by these row blocks RBLK, are turned off according to the bit line control signal BTL, BTR. When the row blocks RBLK are not accessed, the pairs of the switching circuits SW corresponding to the respective control circuits CNT are both ON. The switching circuits SW corresponding to the respective control circuits CNT exclusively used by the single row block RBLK are constantly ON irrespective of whether the row block RBLK is accessed or not.

Specifically, when the row block RBLK1 is accessed during the partial refresh mode, the operation control circuit 24 shown in FIG. 1 only has to turn off the switching circuits SW connected to the row block RBLK15 and positioned on the row block RBLK1 side. The same applies to a case where the row block RBLK0 is accessed. On the other hand, when, for example, the row block RBLK15 is accessed during the partial refresh mode, the operation control circuit 24 has to turn off both of the switching circuits SW connected to the row block RBLK1 4 and positioned on the row block RBLK15 side and the switching circuits SW connected to the row block RBLK1 and positioned on the row block RBLK15 side.

Therefore, power necessary for accessing the row blocks RBLK0-1 positioned on the both ends of the memory core 30 is smaller than power necessary for accessing the other row blocks RBLK2-15. The row blocks RBLK0-1 requiring smaller power consumption for accessing are thus assigned as blocks accessed during the partial refresh mode, so that it is possible to reduce power consumption during the partial refresh mode compared with conventionally required power consumption.

The word lines WL are connected to the sub word decoders SWD. Each of the main word lines MWLX is connected commonly to the four sub word decoders SWD. As described above, the single sub word decoder selected according to the internal row address signal IRA9-10 out of the sub word decoders SWD connected to the activated main word line MWLX activates the word line WL.

FIG. 6 shows details 6f a part surrounded by the frame B in bold broken line shown in FIG. 5. The control circuit CNT includes precharge circuits PRE, sense amplifiers SA, and column switches CSW. The bit lines BL, /BL of the cell arrays ARY are connected to the control circuit CNT via bit line control switches BT (switching circuits SW) controlled by the bit line control signals BTL, BTR as described above.

The bit line control switches BT (switching circuits SW) each constituted of an nMOS transistor are ON while receiving the high-level bit line control signal BTL (or BTR) at gates thereof to connect the bit lines BL (or /BL) in the cell array ARY to the bit lines BL (or /BL) in the control circuit CNT. As the high-level voltage of the bit line control signals BTL, BTR, the boost voltage VPP is used in order to raise gate-to-source voltages of the nMOS transistors and to lower on-resistances thereof. Therefore, in order to change logic levels of the bit line control signals BTL, BTR, not only the operation control circuit 24 but also the boost voltage generator 18 shown in FIG. 1 consumes power. Therefore, power consumption for changing the logic levels of the bit line control signals BTL, BTR is larger than power consumption for changing the logic level of a control signal whose voltage amplitude is the supply voltage VDD. Lowering the frequency of using the boost voltage VPP during the partial refresh mode can bring about a larger effect of reducing power consumption.

Each of the precharge circuits PRE includes a pair of nMOS transistors for connecting the complementary bit lines BL, /BL to a precharge voltage line VPR (VII/2) respectively, and an nMOS transistor for connecting the bit lines BL, /BL to each other. Gates of the nMOS transistors of the precharge circuits PRE receive the bit line reset signal BRS outputted from the operation control circuit 24.

Each of the sense amplifiers SA is constituted of latch circuits whose power supply terminals are connected respectively to signal lines of the sense amplifier activation signals PSA, NSA outputted from the operation control circuit 24. The signal lines of the sense amplifier activation signals PSA, NSA are connected respectively to sources of a pMOS transistor and an nMOS transistor constituting the latch circuits. The sense amplifiers SA operate in synchronization with the control signal from the operation control circuit 24 to amplify a signal amount of data on the bit lines BL, /BL.

Each of the column switches CSW includes an nMOS transistor connecting the bit line BL to the local data bus line LDB, and an nMOS transistor connecting the bit line /BL to the local data bus line /LDB. Gates of the respective nMOS transistors receive the column line signal CL generated by the column decoder CDEC shown in FIG. 1. During the read operation, read data signals on the bit lines BL, /BL amplified by the sense amplifier SA are transmitted to the local data bus lines LDB, /LDB via the column switches CSW. During the write operation, write data signals supplied via the local data bus lines LDB, /LDB are written to the memory cell MC via the bit lines BL, /BL.

Figure 7:
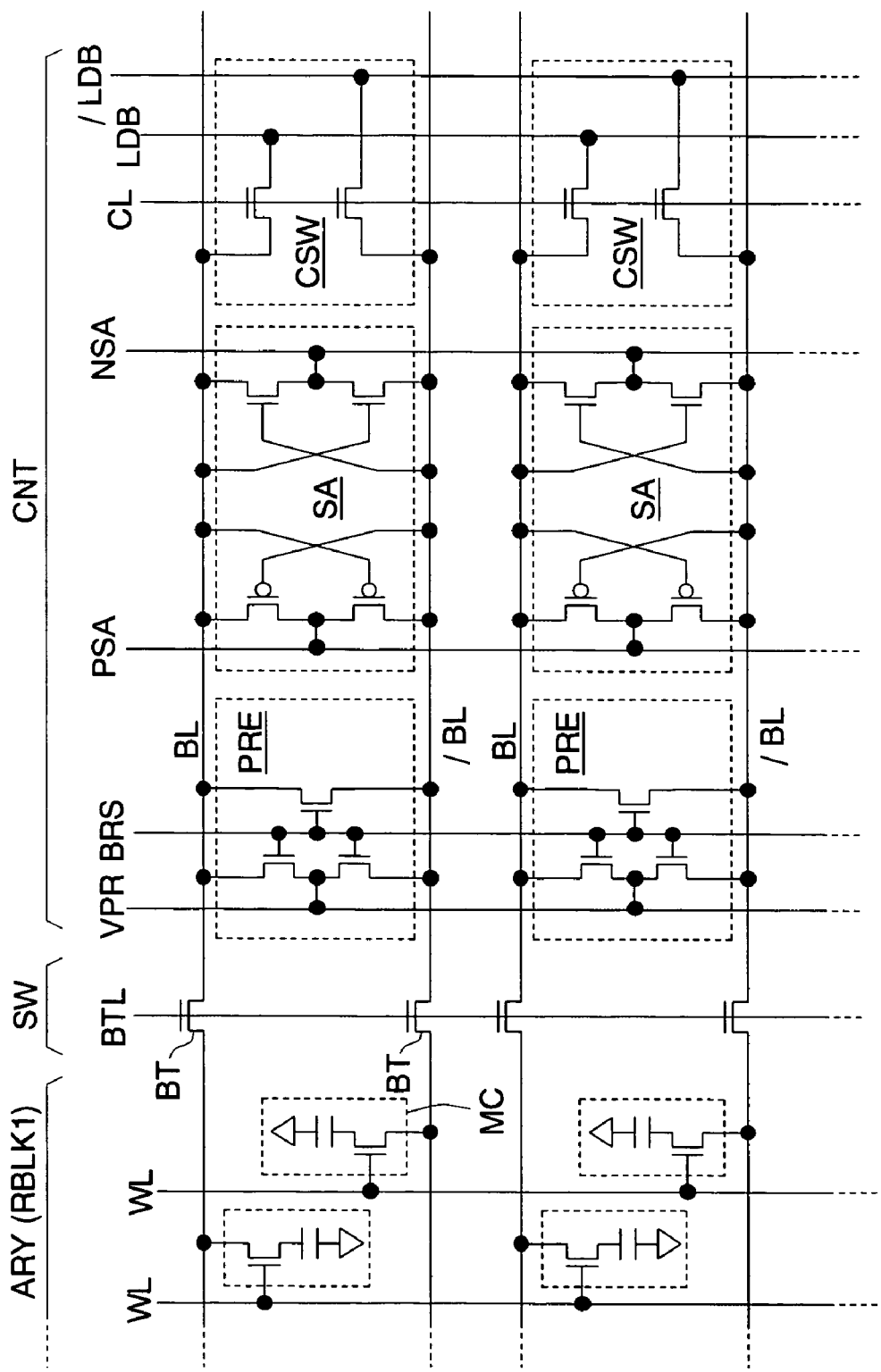
FIG. 7 is a circuit diagram showing details of a part surrounded by the frame C in bold broken line shown in FIG. 5.

FIG. 7 shows details of a part surrounded by the frame C in bold broken line shown in FIG. 5. A circuit shown in FIG. 7 has a structure where the bit line control switches BT connected to the bit line control signal BTR and the cell arrays ARY connected to these bit line control switches BT in FIG. 6 are excluded.

In this embodiment described above, the row blocks RBLK0-1 connected to the bit line control switches BT which are ON during the partial refresh mode are included in the partial area, so that the number of the bit line control switches BT ON/OFF-operating during the partial refresh mode can be decreased. As a result, power consumption during the partial refresh mode (standby current) can be reduced. In particular, since the nMOS transistors constituting the bit line control switches BT receive the boost voltage VPP at the gates thereof, the effect of reducing power consumption is significant.

The row blocks RBLK0-1 are included in all the partial areas (1/2, 1/4, and 1/8 partial modes) settable by the mode register 12, which makes it possible to reduce power consumption during the partial refresh mode without depending on the size of the set partial areas.

The refresh address counter 16 fixes at least one bit of the high-order bits RFA18-20 of the refresh address signal RFA to low level according to the set value of the mode register 12. That is, the partial areas (1/2, 1/4, and 1/8 partial modes) are allocated to smaller addresses in the address map. Therefore, it is possible to reduce power consumption during the partial refresh mode without sacrificing usability by a user using the pseudo SRAM.

Figure 8:
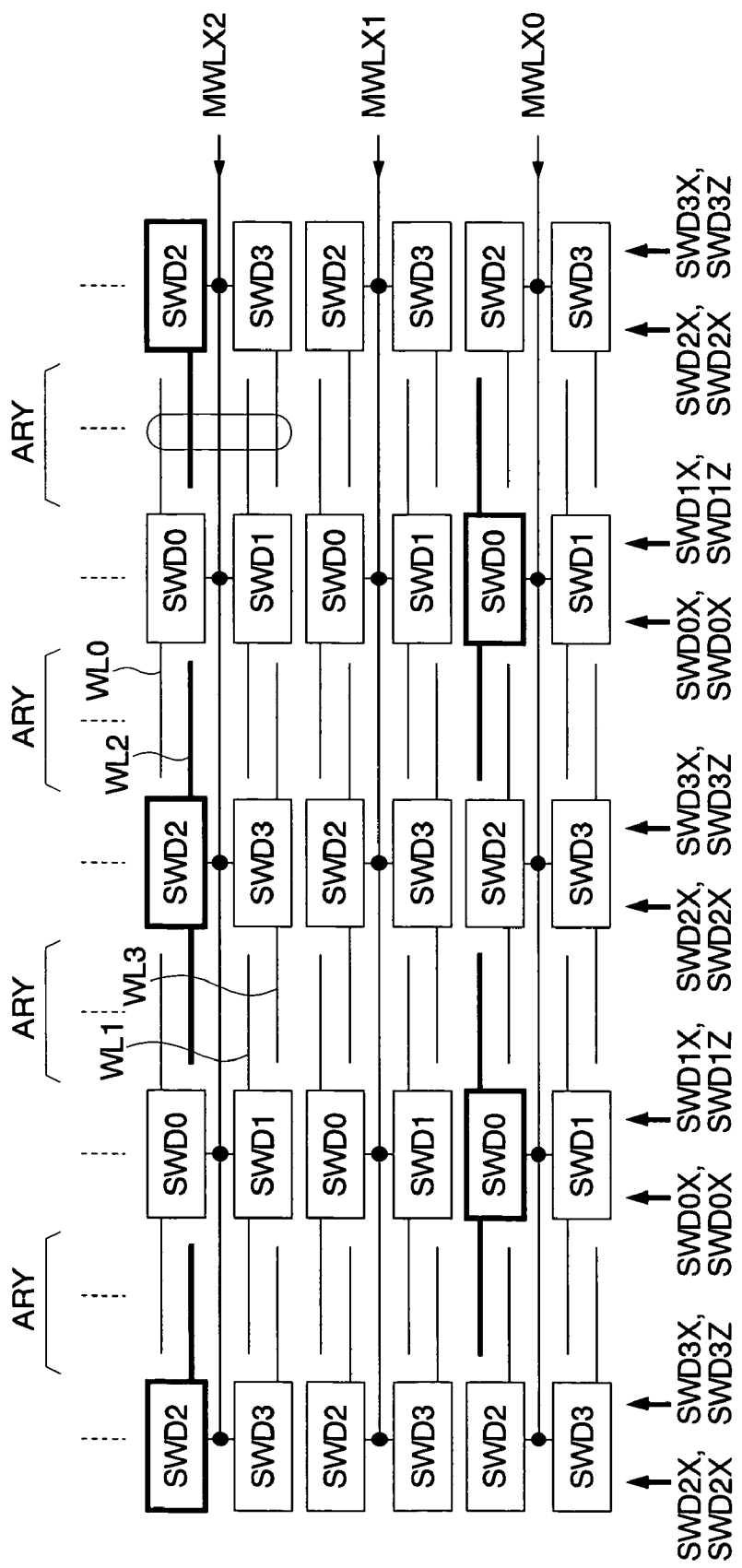
FIG. 8 is a block diagram showing a row block in a second embodiment of the semiconductor memory of the present invention.

FIG. 8 shows a row block in a second embodiment of the semiconductor memory of the present invention. The same reference symbols are used to designate the same circuits/signals as the circuits/signals described in the first embodiment, and detailed description thereof will be omitted. The semiconductor memory of this embodiment, similarly to that of the first embodiment, is formed as a pseudo SRAM on a silicon substrate by using a CMOS process. For example, this pseudo SRAM has a memory capacity of 32 Mbits (2M addresses×16 I/O) and is used as a work memory mounted on portable equipment such as a mobile phone.

An address map showing memory areas in the pseudo SRAM is different from that of the first embodiment. More specifically, bits of a row address signal allocated for selecting a row block RBLK0-15, a main word line MWLX, and a word line WL are different from those of the first embodiment. Further, the allocation of dynamic memory cells whose data are retained during the partial refresh mode is different from that of the first embodiment. The other structure is the same as that of the first embodiment, and the whole block of the pseudo SRAM is the same as that shown in FIG. 1 except that wiring layout of a word decoder WDEC is different.

Each of the row blocks RBLK (any of the row blocks RBLK0-RBLK15) has four cell arrays ARY and five sub word decoders SWD (any of SWD0-3) arranged in a lateral direction in the drawing. That is, each of the row blocks RBLK has an even number of the cell arrays ARY. The sub word decoders SWD (decoding circuits, sub decoders) are arranged between the cell arrays ARY adjacent to each other and on outer sides of the cell arrays ARY positioned at both ends of the lateral direction in the drawing.

Each of the sub word decoders SWD activates one of four word lines WL (for example, those shown by the oval in the drawing) corresponding to one main word line MWLX (one of MWLX0, 1, 2, . . . ) activated by the main word decoder MWD (main decoder) shown in FIG. 2, in each cell array ARY, according to sub word decoded signals SWDZ (SWD0Z-SWD3Z), SWDX (SWD0X-SWD3X) corresponding to an internal row address signal IRA10-9. That is, the sub word decoder SWD outputs a decoded signal corresponding to the internal row address signal IRA10-9 to the word line WL.

The sub word decoded signals SWDZ, SWDX are complementary signals and the decoded signals of the internal row address signal IRA10-9. The final numerals of the sub word decoders SWD0-3 correspond to "00", "01", "10", "11" in binary notation indicated by the internal row address signal IRA10-9. For example, when the internal row address signal IRA10-9 has "01", the sub word decoder SWD1 is selected.

The even-numbered sub word decoders SWD0 (or SWD1) arranged in the lateral direction in the drawing operate when receiving the same sub word decoded signals SWD0Z, SWD0X (or SWD1Z, SWD1X). The odd-numbered sub word decoder SWD2 (or SWD3) arranged in the lateral direction in the drawing operate when receiving the same sub word decoded signals SWD2Z, SWD2X (or SWD3Z, SWD3X). In other words, the even-numbered sub word decoders SWD0-1 are assigned the same address, and the odd-numbered sub word decoders SWD2-3 are assigned the same address. The address assigned to even-numbered sub word decoders SWD0-1 and the address assigned to the odd-numbered sub word decoders SWD2-3 are different from each other.

For example, when the main word line MWLX2 is activated and the sub word decoders SWD2 shown by the bold-line frames are selected according to the internal row address signal IRA9-10 (="10"), the word lines WL2 shown by the bold lines are selected. At this time, the word lines WL2 are driven by the three sub word decoders SWD2. On the other hand, when the main word line MWLX0 is activated and the sub word decoders SWD0 shown by the bold-line frames are selected according to the internal row address signal IRA9-10 (="00"), the word lines WL0 shown by the bold lines are selected. At this time, the word lines WL0 are driven by the two sub word decoders SWD0. Therefore, the power necessary for a word-line WL selection operation by the sub word decoders SWD0 (or SWD1) is smaller than power necessary for a word line WL selection operation by the sub word decoders SWD2 (or SWD3).

Figure 9:
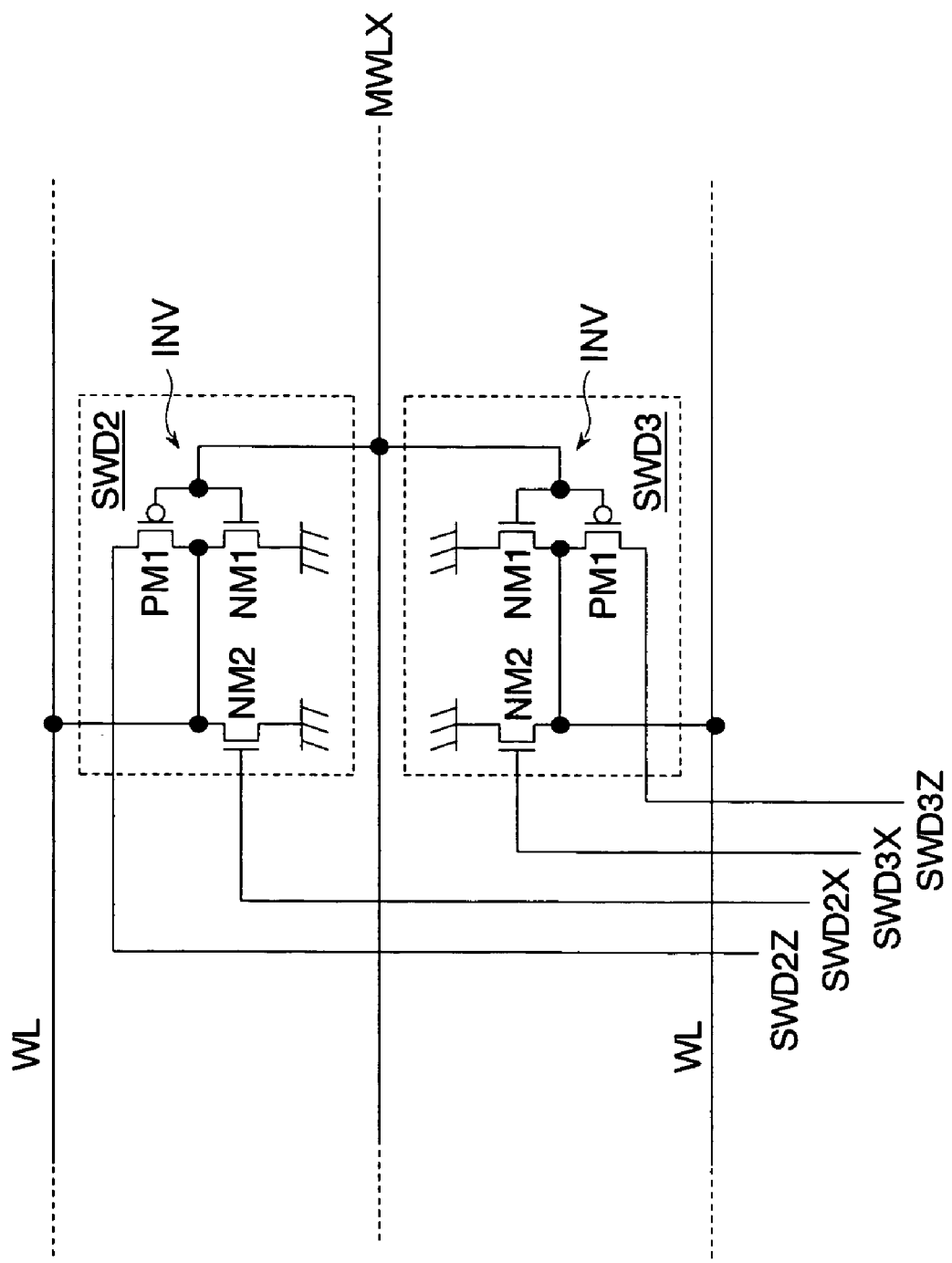
FIG. 9 is a circuit diagram showing details of sub word decoders shown in FIG. 8.

FIG. 9 shows details of the sub word decoders SWD (SWD2-3) shown in FIG. 8. The structure of the sub word decoders SWD0-1 is the same as that in FIG. 9 except that wired signal lines of the sub word decoded signals SWDZ, SWDX are different. Each of the sub word decoders SWD has a CMOS inverter INV (a driver outputting the decoded signal) whose pMOS transistor PM1 has a source connected to a signal line of the sub word decoded signal SWDZ (SWD2Z-SWD3Z) and an nMOS transistor NM2 being an output of the CMOS inverter INV and connected between the word line WL and a ground line VSS. An input of the CMOS inverter INV is connected to the main word line MWLX. A gate of the nMOS transistor NM2 is connected to a signal line of the sub word decoded signal SWDX (SWD2X-SWD3X).

A high-level voltage of the sub word decoded signals SWDZ is set to a boost voltage VPP in order to set an activation voltage of the word lines WL to the boost voltage VPP that is higher than an external supply voltage VDD. Therefore, by the operation of the sub word decoders SWD, power is consumed not only by the sub word decoders SWD but also by a boost circuit (boost voltage generator 18 in FIG. 1) generating the boost voltage VPP.

Figure 10:
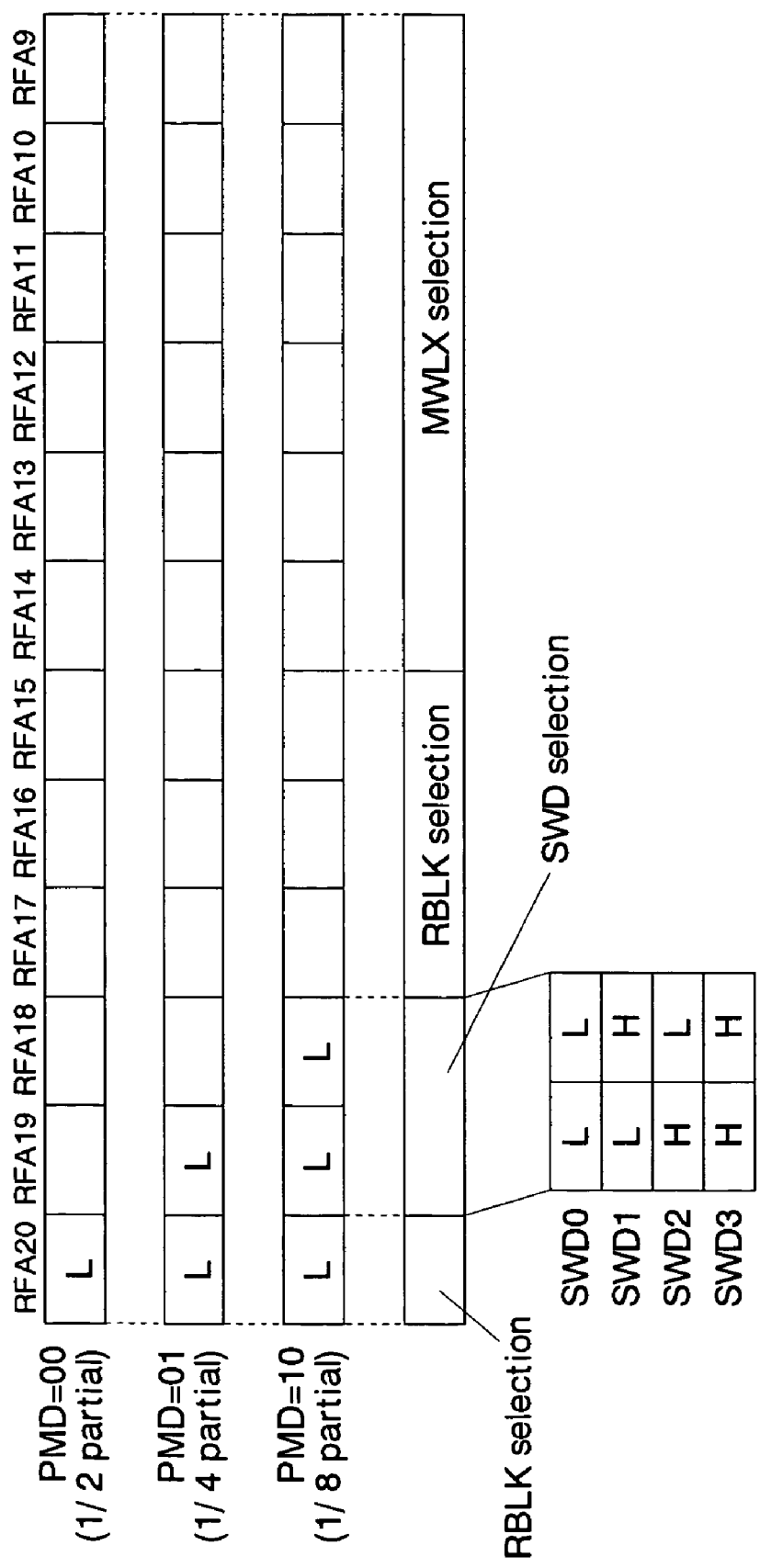
FIG. 10 is an explanatory chart showing a state of a refresh address signal during a partial refresh mode in the second embodiment.

FIG. 10 shows a state of a refresh address signal RFA20-9 during a partial refresh mode in the second embodiment. Similarly to the first embodiment, the highest-order bit RFA20 is fixed to low level (L) in a 1/2 partial mode (PMD="00"). In a 1/4 partial mode (PMD="01"), high-order 2 bits RFA20-19 are fixed to low level (L). In a 1/8 partial mode (PMD="10"), high-order 3 bits RFA20-18 are fixed to low level (L). Each of the partial modes is set by a mode register 12 (FIG. 1).

The refresh address signal RFA20, 17-15 is used for selecting one of the row blocks RBLK. The refresh address signal RFA19-18 is used for selecting one of the sub word decoders SWD0-3. That is, the refresh address signal RFA19-18 is used for selecting one of the four word lines WL connected to the selected main word line MWLX. The refresh address signal RFA14-9 is used for selecting one of the main word lines MWLX in the selected row block RBLK.

In the 1/2 partial mode, only the refresh address signal RFA corresponding to the row blocks RBLK0-7 is generated and only data of the row blocks RBLK0-7 are retained. In the 1/4 partial mode, only the refresh address signal RFA corresponding to the row blocks RBLK0-7 is generated and only the sub word decoders SWD0-1 are selected. Then, only data of memory cells MC connected to the word lines WL corresponding to the sub word decoders SWD0-1 in the row blocks RBLK0-7 are retained. In the 1/8 partial mode, only the refresh address signal RFA corresponding to the row blocks RBLK0-7 is generated and only the sub word decoders SWD0 are selected. Then, only data of the memory cells MC connected to the word lines WL corresponding to the sub word decoders SWD0 in the row blocks RBLK0-3 are retained.

In this embodiment, similarly to the first embodiment (FIG. 2), the row blocks RBLK0-1 are arranged at both ends of a vertical direction Y in the memory core 30. Therefore, power consumption for accessing the row bocks RBLK0-1 is smaller than power consumption for accessing the other row blocks RBLK2-15. Further, power consumption necessary for the word line selection operation by the sub word decoders SWD0 (or SWD1) selected during the 1/4 and 1/8 partial modes is smaller than power consumption necessary for the word line selection operation by the sub word decoders SWD2-3. In this manner, by setting partial areas so that circuit blocks, the access to which requires smaller power consumption operate during the refresh operation, it is possible to reduce power consumption during the partial refresh mode.

This embodiment described above can also provide the same effects as those of the first embodiment previously described. Further, in this embodiment, the memory cells MC corresponding to the sub word decoders SWD0 (or SWD0-1) which operate simultaneously in small number are included in the partial area, so that it is possible to reduce the number of the sub word decoders SWD operating during the partial refresh mode. As a result, power consumption during the partial refresh mode can be reduced. In particular, since the sub word decoders SWD use the boost voltage VPP for driving the word lines WL, the effect of reducing power consumption is significant.

The memory cells MC connected to the word lines WL corresponding to the sub word decoders SWD0 (or SWD0-1) are included in the partial areas (1/4 and 1/8 partial modes) settable by the mode register 12, and the memory cells MC connected to the word lines WL corresponding to the sub word decoders SWD2-3 are excluded from the partial areas (1/4 and 1/8 partial modes), which makes it possible to reduce power consumption during the partial refresh mode without depending on the size of the set partial areas.

Figure 11:
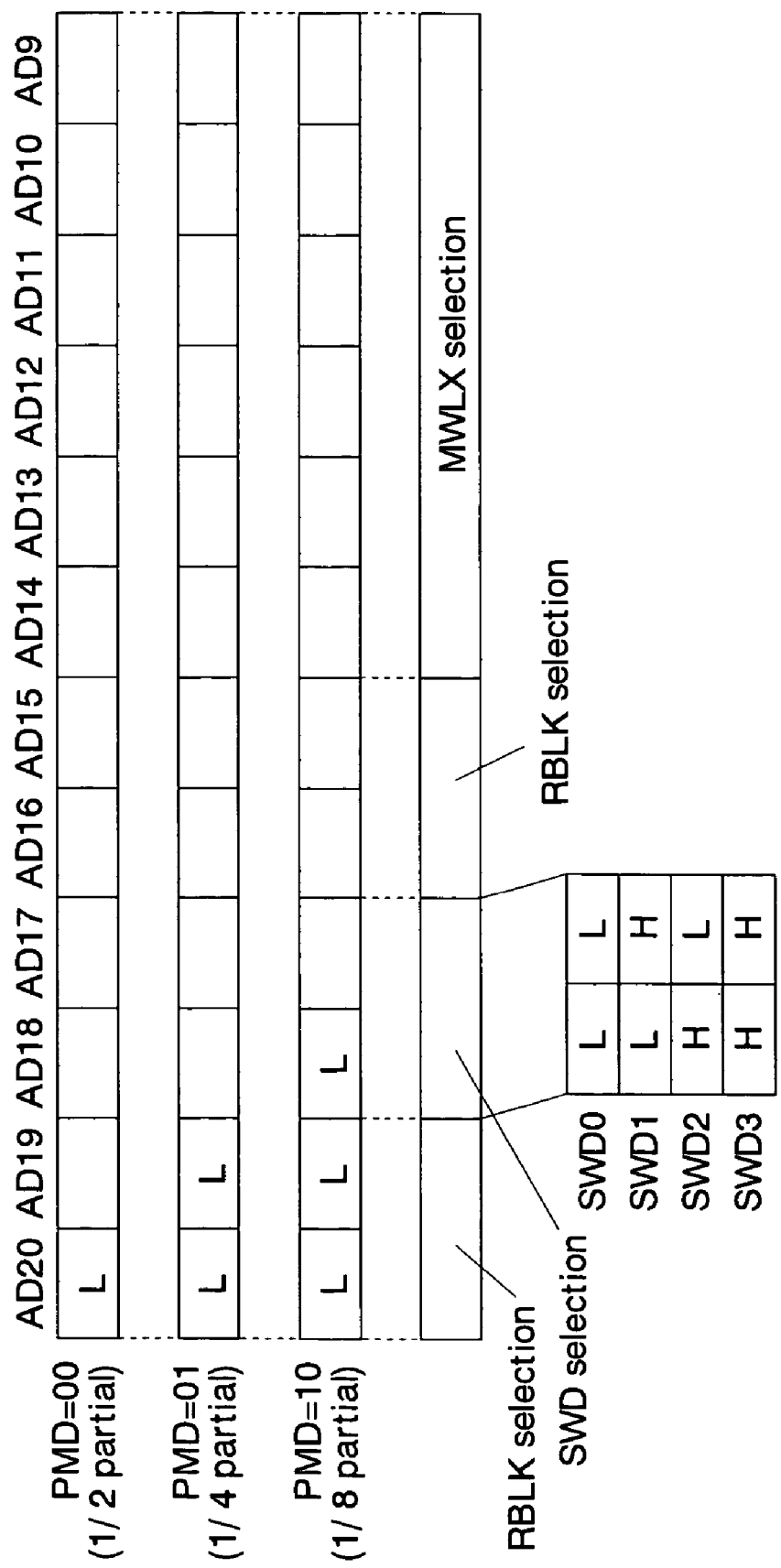
FIG. 11 is an explanatory chart showing a state of a refresh address signal during a partial refresh mode in a third embodiment of the semiconductor memory of the present invention.

FIG. 11 shows a state of a refresh address signal RFA20-9 during a partial refresh mode in a third embodiment of the semiconductor memory of the present invention. The same reference symbols are used to designate the same circuits/signals as the circuits/signals described in the first and second embodiments, and detailed description thereof will be omitted.

The semiconductor memory of this embodiment, similarly to that of the first embodiment, is formed as a pseudo SRAM on a silicon substrate by using a CMOS process. For example, this pseudo SRAM has a memory capacity of 32 Mbits (2M addresses×16 I/O) and is used as a work memory mounted on portable equipment such as a mobile phone.

In this embodiment, the refresh address signal RFA20-19, 16-15 is used for selecting one of row blocks RBLK. The refresh address signal RFA18-17 is used for selecting one kind out of sub word decoders SWD0-3. The refresh address signal RFA14-9 is used for selecting one of main word lines MWLX in the selected row block RBLK. The other structure is the same as that of the first and second embodiments.

In a 1/2 partial mode, only the refresh address signal RFA corresponding to the row blocks RBLK0-7 is generated and only data of the row blocks RBLK0-7 are retained. In a 1/4 partial mode, only the refresh address signal RFA corresponding to the row blocks RBLK0-3 is generated and only data of the row blocks RBLK0-3 are retained. In a 1/8 partial mode, only the refresh address signal RFA corresponding to the row blocks RBLK0-3 is generated and only the sub word decoders SWD0-1 are selected. Then, only data of memory cells MC connected to word lines WL corresponding to the sub word decoders SWD0-1 in the row bocks RBLK0-3 are retained.

In the 1/8 partial mode, only data of the memory cells MC corresponding to the sub word decoders SWD0-1 which operate in small number at the time of accessing are retained, and data of memory cells MC corresponding to the sub word decoders SWD2-3 are not retained. Therefore, it is possible to reduce power consumption per memory cell MC whose data is retained in the 1/8 partial mode, compared with power consumption per memory cell MC whose data is retained in the 1/4 partial mode.

This embodiment described above can also provide the same effects as those of the first and second embodiments previously described.

The foregoing embodiments have described the examples where the present invention is applied to the pseudo SRAM having the 16 row blocks RBLK0-15. However, the present invention is not limited to such embodiments. For example, the present invention is applicable to a pseudo SRAM having three row blocks RBLK or more. Especially when the present invention is applied to a pseudo SRAM having four row blocks RBLK, only row blocks RBLK0-1 arranged at both ends of a memory core can be set as the partial areas in all the partial modes (1/2, 1/4, 1/8), which brings about a distinguished effect in the structure of the second embodiment.

The foregoing embodiments have described the examples where the present invention is applied to the pseudo SRAM. However, the present invention is not limited to such embodiments. The present invention may be applied to, for example, a DRAM.

The invention is not limited to the above embodiments and various modifications may be made without departing from the spirit and scope of the invention. Any improvement may be made in part or all of the components.

What is claimed is:

1. A semiconductor memory comprising:
    three or more memory blocks each of which has dynamic memory cells and which are arranged in one direction and operate at different timings from each other;
    control circuits each of which is arranged between memory blocks adjacent to each other and shared by the adjacent memory blocks and operates in synchronization with an operation of one of the adjacent memory blocks;
    control circuits arranged respectively on outer sides of said memory blocks arranged at both ends of the one direction, and operating in synchronization with operations of the respective memory blocks;
    switching circuits each connecting each of said control circuits to an adjacent memory block; and
    an operation control circuit which constantly keeps, during a partial refresh mode, the switching circuits ON which are corresponding to the control circuits positioned on the outer sides of the memory blocks arranged at the both ends, the partial refresh mode being to retain data of at least one of said memory blocks, wherein
    a partial area is set to include said memory blocks arranged at the both ends, the partial area representing the memory block for which a refresh operation is executed during said partial refresh mode.

2. The semiconductor memory according to claim 1, wherein:
    said control circuits are sense amplifiers; and
    said switching circuits are bit line control switches that connect, to said sense amplifiers, bit lines connected to said memory cells of said memory blocks.

3. The semiconductor memory according to claim 1, wherein:
    said control circuits are precharge circuits; and
    said switching circuits are bit line control switches that connect, to said precharge circuits, bit lines connected to said memory cells of said memory blocks.

4. The semiconductor memory according to claim 1, wherein:
    said control circuits are column switches connecting bit lines to a data bus line; and
    said switching circuits are bit line control switches that connect, to said column switches, bit lines connected to said memory cells of said memory blocks.

5. The semiconductor memory according to claim 1, further comprising
    a boost voltage generator generating a boost voltage that is higher than an external supply voltage, wherein:
    each of said switching circuits is constituted of an nMOS transistor; and
    a high-level voltage of a switch control signal supplied to a gate of said nMOS transistor is the boost voltage.

6. The semiconductor memory according to claim 1, further comprising
    a mode register that is set from an exterior of the semiconductor memory in order to change size of said partial area, wherein
    the memory blocks arranged at the both ends are included in a plurality of partial areas which are settable.

7. The semiconductor memory according to claim 1, further comprising
    a refresh address counter sequentially generating a refresh address for refreshing said memory cells, wherein:
    the memory blocks included in said partial area are assigned smaller addresses in an address map; and
    said refresh address counter fixes at least one of high-order bits of said refresh address to low level when outputting said refresh address during said partial refresh mode.

8. A semiconductor memory comprising:
an even number of cell arrays each of which has dynamic memory cells and which are arranged in one direction; and
decoding circuits arranged between cell arrays adjacent to each other and arranged on outer sides of the cell arrays arranged at both ends of the one direction, wherein;
odd-numbered decoding circuits counting from an end of said one direction are assigned a same address;
even-numbered decoding circuits counting from the end of said one direction are assigned a same address;
the address assigned to the odd-numbered decoding circuits and the address assigned to the even-numbered decoding circuits are different from each other;
each of the decoding circuits arranged between the adjacent cell arrays includes a driver outputting a decoded signal to the adjacent cell arrays;
each of the decoding circuits arranged on the outer sides of the cell arrays at the both ends of said one direction includes a driver outputting a decoded signal to one adjacent cell array; and
a partial area is set to include the memory cells connected to the drivers of the even-numbered decoding circuits, the partial area representing the memory cells for which a refresh operation is executed during a partial refresh mode to retain data of at least one of said memory blocks.

9. The semiconductor memory according to claim 8, further comprising:
a main decoder decoding high-order addresses; and
sub decoders decoding low-order addresses according to an output of the main decoder, wherein
said decoding circuits are the sub decoders.

10. The semiconductor memory according to claim 8, further comprising
word lines connected to gates of transfer transistors of said memory cells, wherein
said decoded signals outputted by said decoding circuits are supplied to said word lines.

11. The semiconductor memory according to claim 8, further comprising
a mode register that is set from an exterior of the semiconductor memory in order to change size of said partial area, wherein:
the memory cells corresponding to said even-numbered decoding circuits are included in a plurality of partial areas which are settable; and
the memory cells corresponding to said odd-numbered decoding circuits are not included in the plurality of settable partial areas.

* * * * *